United States Patent [19]

Davis

[11] 4,143,186

[45] Mar. 6, 1979

[54] PROCESS FOR ELECTROLESS COPPER DEPOSITION FROM AN ACIDIC BATH

[75] Inventor: Thomas F. Davis, Harrisburg, Pa.

[73] Assignee: AMP Incorporated, Harrisburg, Pa.

[21] Appl. No.: 815,409

[22] Filed: Jul. 13, 1977

Related U.S. Application Data

[63] Continuation of Ser. No. 724,668, Sep. 20, 1976, abandoned, which is a continuation of Ser. No. 602,345, Aug. 6, 1975, abandoned.

[51] Int. Cl.$^2$ .............................................. C23C 3/02
[52] U.S. Cl. .................................. 427/345; 106/1.23; 106/1.26; 427/98; 427/305; 427/306; 427/430 A
[58] Field of Search ................ 427/98, 304, 305, 306, 427/328, 345, 437, 430 A; 106/1, 1.23, 1.26

[56] References Cited

U.S. PATENT DOCUMENTS

| | | | |
|---|---|---|---|
| 3,431,120 | 4/1969 | Weisenberger | 427/437 |
| 3,615,733 | 10/1971 | Shipley et al. | 106/1 |
| 3,736,170 | 5/1973 | Lo | 427/304 |
| 3,791,848 | 6/1973 | De Angelo | 427/306 |

OTHER PUBLICATIONS

Pearlstein et al., *Plating*, vol. 60, pp. 474 to 476 (1973).
*Modern Electroplating*, John Wiley & Sons, pp. 734, 735 c 1974.
Brenner, "Electroless Plating Comes of Age" Metal Finishing, Nov., 1954.

*Primary Examiner*—John D. Smith

[57] ABSTRACT

An electroless plating process for copper in an acidic bath whereby copper by a chemical reduction process is continuously being plated to a desired thickness on a suitable substrate; this process is especially applicable to plating of copper and substrates which are susceptible to alkaline solutions such as polyimides, polyparabanic acids, etc.

11 Claims, No Drawings

PROCESS FOR ELECTROLESS COPPER DEPOSITION FROM AN ACIDIC BATH

This is a continuation of application Ser. No. 724,668, filed Sept. 20, 1976, which, in turn, is a continuation of Ser. No. 602,345, filed Aug. 6, 1975, both abandoned.

This invention relates to copper plating processes and solutions, more particularly, this invention relates to an electroless plating of copper in an acidic bath whereby copper by a chemical reduction process is continuously being plated to a desired thickness on a substrate. The present invention is especially applicable to plating of substrates which are susceptible to alkaline solutions. For example, high temperature substrates such as polyimides, polyparabanic acids, polyimides-amides, and polyhydantoins are especially adaptable for plating with an electroless copper solution of the present invention.

THE BACKGROUND OF THE INVENTION

In plating copper electrolessly, the prior art processes have all substantially conducted the plating operation on an alkaline pH side of the pH scale such as above pH 8 and above employing generally the —OH (hydroxide) radical supplied by sodium hydroxide, potassium hydroxide, or various other alkaline agents, such as sodium carbonates, ammonium, etc. However, it is well known, the high temperature substrates which are finding increasing application as replacements for metal substrates in flexible, flat circuitry are especially susceptible to an alkaline attack. For example, the polyimides which will be further disclosed herein are susceptible to an alkaline attack and many electroless copper deposition processes are not suitable with polyimide substrates because these processes are invariably carried out in an alkaline medium.

Other substrates previously mentioned above are equally susceptible to the alkaline or alkali attack and, therefore, a viable and efficient acid bath from which copper can be plated electrolessly has been a desideratum in the art.

BRIEF DESCRIPTION OF PRIOR ART

In U.S. Pat. No. 2,874,072, an autocatalytic plating process and solution has been described. However, this solution falls in the prior art category wherein the electroless deposition is carried out on the alkali or alkaline side of the pH scale.

Other pertinent prior art is disclosed in U.S. Pat. No. 3,361,580 but again the process as carried out in the illustrated examples shows that the electroless copper deposition is from an alkaline bath generally at a pH value of 10 and above. Further, U.S. Pat. No. 3,403,035 describes autocatalytic metal deposition solutions for copper, nickel, cobalt, cadmium, tin, and similar metals. Although in the disclosure it is alleged that the solution pH will depend upon the nature of the metallic salt, the sequestering agent and the reducing agent, in the disclosure it is further stated that depending on the ingredients, the pH may range from strongly acid to strongly alkaline, that is, from pH of 1 to 14 and usually from 4 to 14. However, the copper baths disclosed in this patent are generally at a pH of about 10, although an acid bath has been disclosed therein. However, the disclosed acid bath contains both sodium cyanide and sodium hypophosphite. The disclosed bath not only requires the presence of sodium cyanide for deposition of copper, but apparently also requires the presence of sodium cyanide for deposition of bright copper film. As it is well known to those skilled in the art, the danger of an acid bath being used in conjunction with sodium cyanide is that hydrocyanic acid or cyanic acid may be released from a bath. Despite the fact that very small amounts have been disclosed, the dangerous condition exists and any error in the amount of added sodium cyanide may be extremely undesirable.

Another patent which discloses electroless copper plating bath and further improvements therefor is U.S. Pat. No. 3,607,317. Again, this patent fails to disclose a bath which deposits copper from the bath at a pH on the acid side.

DESCRIPTION OF THE PRESENT INVENTION

The present invention is directed to a high speed electroless copper deposition process, a bath suitable for deposition of copper according to the high speed process, and a combination of salts capable of dilution and useful in the bath as an article of manufacture.

Still further, the present invention is directed to deposition of copper on conductive as well as nonconductive substrates and the deposition of copper for totally additively formed circuits.

As it is well known in the art, in order to obtain an electroless metal deposit, it is necessary first to treat the substrate in the conventional manner such as by degreasing or cleaning including abrading. Thereafter, a suitable catalyst such as palladium chloride is used in conjunction with tin causing the palladium chloride to reduce to a palladous metal. The electroless deposition from an electroless bath can then take place on the surface catalyzed by palladium metal.

Other catalysts are also well known in the art and may be employed to provide the catalytically active surface on which the copper may then be deposited from the electroless bath. Among other methods which have been disclosed in the art are methods whereby the nonconductive substrates such as Kapton (H-film or polyimide polymer which are synonyms for the same material) are treated with an agent such as hydrazine and the palladium chloride thereafter deposited thereon. The substrate is thereafter irradiated by ultra-violet radiation which causes the palladium chloride to be decomposed to the catalytically active palladium metal on which then the electroless copper may be deposited.

The last mentioned method provides for a totally additive process, i.e., circuit patterns may be obtained by irradiating the polyimide surface containing the palladium dichloride and the inactive surface defines the nonconducting areas. The active catalyst surface provides the conducting or conductive areas of the circuit.

With reference to the copper salts, these are two valent salts and are added as soluble salt to an aqueous solution. Generally, the salt is $CuSO_4 \cdot 5H_2O$.

As a concentrate, the amounts are stated for adding to a 1 liter solution. However, the relative proportions remain the same and can be converted to any other system, e.g., oz/gal., gr/gal., etc. Thus, the appropriate weights based on the salt added can be readily calculated by those skilled in the art.

For copper sulfate, it is found that the range should be from 4 grams/liter to 50 grams/liter.

In addition, a complexing agent which buffers the solution to the desired pH range is added to the solution. Complexing agents suitable for this purpose are tartrates, acetates, glycolic acid, and ethylene diaminetetraacetic acid. The following complexing agents are also useful: nitrilotriacetic acid, glyconic acid, glyconates, or triethanol amines.

Dimethyl amine borane is used as the preferred reducing agent. The deposit of copper contains only traces or boron which is easy to overplate by an electrolytic process.

Still further, stabilizing agents are added to the bath which prevent decomposition. Suitable stabilizing agents are thioureas in an amount of 0.01 to 1.0 ppm; antimony, arsenic, and bismuth alone or in combination, in an amount of 1.0 to 20 ppm.

The above mentioned stabilizers such as antimony, arsenic, or bismuth are preferably in a lower oxidation state such as a 2 valent or 3 valent state although the higher valent states will also work but not as well.

Although the narrower ranges have been indicated above, it has been found that the additives such as antimony, bismuth, and arsenic compounds or the mixtures of the two, or any of the above, may be added to the bath in concentration of 1 to 100 ppm based on the metal. As mentioned before, these can be added in the lower oxidation state although any oxidative state will work, that is, the higher or lower valent state species are operative in the process.

To sum up the stabilizing additives, these may be in the form of fluorides, nitrates, and tartrates of the elements above, or these compounds may be in the form such as sodium arsenite.

Still further, an additional buffering agent, i.e., citrates, acetates, pyrophosphates, and ethylene diamine may be used as a complexing agent as well.

In order to adjust the pH of the bath within the desired limits, generally, it is adjusted with ammonium hydroxide; potassium or sodium hydroxides are equally useful.

The operating temperature of the bath is generally from 70° to 160° F.

When the components of the bath are changed, e.g., by exhaustion, these changes generally still fall within an operable pH range of 4.0 to 7.5 and the preferred range, as it can be easily seen from the above, can be adjusted with the ammonium hydroxide in the above indicated preferred range from 6.5 to 7.2.

With reference to the combination of stabilizers, the same work with any of the systems and the stabilizers such as antimony, arsenic, etc. can be used in the form of antimony tartrate, or the trichlorides, i.e., generally the water soluble salts.

In summarizing the above, the general operating conditions for the bath are as follows:
1. $Cu^{++}$ added as any soluble salt, such as sulfate, nitrate, chloride, etc. 0.05 to 0.15 M
2. Dimethylamine borane as a reducing agent
3. A complexing agent that buffers in the pH range desired (tartrates, acetates, glycolic acid).
4. Stabilizing agents to prevent decomposition (thiourea — 0.001 to 1.0 ppm, antimony, arsenic, and bismuth — alone or in combination — 1 to 20 ppm)

Appropriate bath compositions are to follow:

| A. Bath Composition | Grams per Liter |
|---|---|
| $CuSO_4 \cdot 5H_2O$ | 4 to 24 g/l |
| Dimethylamine borane | 8 to 24 g/l |
| Ethylenediamine tetraacetic acid | 12 to 72 g/l |
| $KH_2PO_4$ (as a pH buffer) | 20 to 60 g/l |
| Operating pH = 5.0 to 7.0; temperature = 140° to 180° F. | |

| B. Bath Composition | Grams per Liter |
|---|---|
| $CuSO_4 \cdot 5H_2O$ | 25 g/l |
| $K_4P_2O_7$ | 100 g/l |
| Dimethylamine borane | 5 g/l |
| Operating pH = 6.0 to 7.5; temperature = 70° to 100° F. | |

| C. Bath Composition | Grams per Liter |
|---|---|
| $CuSO_4 \cdot 5H_2O$ | 15 to 30 g/l |
| $K_4P_2O_7 \cdot 3H_2O$ | 50 to 200 g/l |
| DMAB (Dimethylamine borane) | 3 to 7 g/l |
| Operating pH = 6.5 to 7.5; temperature = 70° to 100° F. | |

| D. Bath Composition | Grams per Liter |
|---|---|
| $CuSO_4 \cdot 5H_2O$ | 6 to 10 g/l |
| triethylene tetramine | 15 to 40 g/l |
| DMAB | 6 to 10 g/l |
| Operating pH = 6.5 to 7.5; temperature = 120° to 160° F. | |

| E. Bath Composition | Grams Per Liter |
|---|---|
| $CuSO_4 \cdot 5H_2O$ | 5 to 10 g/l |
| ethylene diamine | 10 to 20 g/l |
| DMAB | 8 to 12 g/l |
| Operating pH = 6.5 to 7.5; temperature = 70° to 100° F. | |

| F. Bath Composition | Grams Per Liter |
|---|---|
| $CuSO_4 \cdot 5H_2O$ | 6 to 10 g/l |
| nitrilotriacetic acid | 10 to 30 g/l |
| DMAB | 2 to 4 g/l |
| Operating pH = 5.0 to 7.5; temperature = 90° to 110° F. | |

All of the above baths contain as a stabilizer one or more of the stabilizers mentioned herein.

After the electroless deposition, the deposit may be overplated electrolytically as it is well known in the art with copper or with various other metals in various combinations as it is needed, all as well known in the art.

The electroless deposit adhered to the substrate in an acceptable manner as determined by the scotch tape test showing sufficiently good adhesion as required for the various circuit use applications.

Although the substrates which have been mentioned above lend themselves especially well to the described electroless deposition, these and other useful substrates will now be further described as follows: polyarylsulfone; polyparabanic acid disclosed in U.S. Pat. Nos. 3,547,897; 3,591,562; and 3,661,859; the previously mentioned polyimides and polyimides-amides; polyphenylene sulfide; polysulfones; silicon polymers, e.g., dimethyl or diphenyl siloxanes (room temperature vulcanizates) and poly-2,4-imidazolidine diones(-polyhydantoins) (manufactured by Bayer A. G., Germany and available from Mobay Chemical, Pittsburg, Pa.). A number of the above polymers are described in Lee et al., *New Liner Polymers*, McGraw-Hill, New York, New York (1967). Still additional useful polymer substrates are epoxides, polyesters, etc.

The preferred substrates are the polyimides, and next the various polyimide-amide, polyhydantoin and polyparbanic acid substrates.

These are all high temperature substrates and are therefore very useful in electronic circuit application, where high temperature resistance is essential. Moreover, the substrates when electrolessly plated by the above method and can be also used for a solder dip application and thus, these must pass the 5 to 10 second solder dip test at a temperature of 210° to 220° C.

What is claimed is:
1. A method for electroless deposition of copper on a substrate of a high temperature polymer said deposition being from a bath in which copper has been dissolved, said substrate being pretreated to receive the deposited copper said method including the steps comprising of:

contacting said substrate with an aqueous electroless bath having a pH in the range from 4.0 to 7.5 and having a soluble copper salt therein and a) as a reducing for said bath, dimethylamine borane; b) as a complexing agent for said copper, a pyrophosphate, an orthophosphate, ethylene diamine tetraacetic acid, nitrilotriacetic acid, an ethylene diamine, or triethylene tetraamine or mixtures of said amines;

maintaining the pH of the solution in the range from 4.0 to 7.5, if needed, by adjustment with the addition of ammonium hydroxide, sodium hydroxide, or potassium hydroxide; and maintaining, while depositing said copper on said substrate, the temperatures of the bath from 70° to 160° F.

2. The process as defined in claim 1, wherein in the bath is incorporated, as a stabilizing agent, thiourea, antimony, arsenic, bismuth, or mixtures of same.

3. The process as defined in claim 1, wherein the stabilizing agents are incorporated in an amount from 0.01 to 100 ppm.

4. The process as defined in claim 1, wherein thiourea is the stabilizing agent and is incorporated in an amount from 0.01 to 1.0 ppm.

5. The stabilizing additive as defined in claim 1, wherein the same is 1 to 10 miligrams per liter of antimony based on the metal.

6. The process as defined in claim 1, wherein the stabilizing additive is 1 to 10 miligrams per liter of arsenic.

7. The process as defined in claim 1, wherein the stabilizing additive is an antimony tartrate, sodium arsenate, antimony trichloride, or arsenic trichloride.

8. The process as defined in claim 7, wherein the stabilizing additive is in the lower valent state.

9. The process as defined in claim 1, wherein the substrate is a polyimide polymer.

10. The process as defined in claim 1, wherein the substrate is a polyparbanic acid polymer.

11. The process as defined in claim 1, wherein the substrate is polyimide-amide polymer.

* * * * *